(12) United States Patent
Ecker

(10) Patent No.: US 6,263,481 B1
(45) Date of Patent: Jul. 17, 2001

(54) SIGNAL PROPAGATION TIME OPTIMIZATION METHOD FOR REPROGRAMMABLE CIRCUIT THAT ARRANGES SAME NUMBER OF COMBINATOR BLOCKS BETWEEN EACH TWO UTILIZED REGISTERS ON PROGRAMMED SERIES

(75) Inventor: Wolfgang Ecker, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/090,634

(22) Filed: Jun. 4, 1998

(30) Foreign Application Priority Data

Jun. 4, 1997 (DE) .............................. 197 23 457

(51) Int. Cl.[7] .................................. G06F 17/50
(52) U.S. Cl. .................. 716/16; 716/5; 716/6; 716/7; 340/825.87
(58) Field of Search ............... 326/38; 327/269, 327/144; 713/401; 375/326; 708/625; 716/4, 5–7, 16; 340/825.87

(56) References Cited

U.S. PATENT DOCUMENTS

| 4,939,687 | * | 7/1990 | Hartley et al. ............... 708/625 |
| 5,343,406 | * | 8/1994 | Freeman et al. .............. 716/16 |
| 5,396,111 | * | 3/1995 | Frangioso et al. ............ 327/144 |
| 5,426,379 | * | 6/1995 | Trimberger ................... 716/6 |
| 5,764,528 | * | 6/1998 | Nakamura ..................... 716/6 |
| 5,844,422 | * | 12/1998 | Trimberger et al. ........... 326/38 |
| 5,857,095 | * | 1/1999 | Jeddeloh et al. .............. 713/401 |
| 5,859,776 | * | 1/1999 | Sato et al. ................... 716/6 |
| 5,875,116 | * | 2/1999 | Oguma et al. ................. 716/4 |
| 5,920,222 | * | 7/1999 | Eustis et al. ................. 327/269 |
| 5,943,369 | * | 8/1999 | Knutson et al. ............... 375/326 |
| 5,956,256 | * | 9/1999 | Rezek et al. .................. 716/7 |

FOREIGN PATENT DOCUMENTS 0 559 322 A2   9/1993 (EP) .

OTHER PUBLICATIONS

IEICE Trans. Fundamentals, vol. E79–A, No. 3 Mar. 1996—pp. 321–329.
Technology Mapping for Sequential Circuits based on Retiming Techniques, Weinmann et al., pp. 318–323.
Patent Abstracts of Japan, vol. 15, No. 62 (E–1033) (4590).
Programmierbare Gate–Arrays, by Willibald Voldan, pp. 51–54.
CIP–Kurztitelaufnahme der Deutschen Bibliothek.

* cited by examiner

Primary Examiner—Matthew Smith
Assistant Examiner—Jibreel Speight
(74) Attorney, Agent, or Firm—Schiff Hardin & Waite

(57) ABSTRACT

A method for optimizing signal running times in a reprogrammable combinational circuit having individual cells which, in turn, contain a respective combinational block and a register. Optimization occurs after the programming of the circuit in that individual registers are reprogrammed; i.e., registers switched used are switched unused or vice versa.

3 Claims, 1 Drawing Sheet

SIGNAL PROPAGATION TIME OPTIMIZATION METHOD FOR REPROGRAMMABLE CIRCUIT THAT ARRANGES SAME NUMBER OF COMBINATOR BLOCKS BETWEEN EACH TWO UTILIZED REGISTERS ON PROGRAMMED SERIES

BACKGROUND OF THE INVENTION

1. Field of the Invention

The present invention relates to a reprogrammable combinational circuit wherein an optimization of the signal running time may be realized after the circuit is already programmed.

2. Description of the Prior Art

A commercially available, reprogrammable combinational circuit is typically programmed with a code (bit stream) that determines which individual circuit in the combinational circuit to be programmed. Thus, a nearly arbitrarily prescribable circuit can be programmed into the reprogrammable combinational circuit.

The reprogrammable combinational circuit includes a plurality of cells, wherein each cell contains a combinational block and a register. The combinational blocks, in turn, perform operations corresponding to a prescribable circuit wherein the registers can be switched between a "used" and "unused" state. Accordingly, the registers allow the circuit to become a synchronous circuit, equivalent to a synchronous combinational circuit, dependent on a clock signal.

A person skilled in the art knows that synchronous circuits are those that are based on a common clock and that switch at identical points in time; whether at the positive edge or the negative edge of the clock signal. A definition of synchronous combinational circuit (=synchronous circuit) is provided in H. -J. Schneider, *Lexikon der Informatik und Datenverarbeitung*, $2^{nd}$ Edition, Oldenbourg Verlag, Munich 1986, ISBN 3-486-22662-2, pp. 508, 509.

Combinational blocks lie between registers in the development of synchronous circuits. The signal running time through the combinational blocks as well as setup time and hold time of the registers determine the maximum clock frequency with which the synchronous circuit can be operated.

The maximum clock frequency of a reprogrammable combinational circuit is often inadequate in practice. An enhancement of such performance capability, therefore, would be desirable.

SUMMARY OF THE INVENTION

The present invention is directed toward optimizing the signal running time in a reprogrammable combinational circuit, wherein the optimization is implemented after the programming of the reprogrammable combinational circuit.

This object is achieved in a method wherein the reprogrammable combinational circuit is programmed with the prescribable circuit. A row of combinational blocks and registers is thereby formed such that each register is optionally connected either used or unused. The optimization of the signal running times occurs after the programming in that pluralities of combinational blocks respectively between two registers switched used are selected approximately equal in the row.

The present invention also teaches a reprogrammable combinational circuit that contains a program code optimized in signal running time, wherein approximately equal pluralities of combinational blocks are arranged between registers switched used. It is advantageous to implement the optimization of the signal running times after the programming of the combinational circuit since the signal running times can be exactly identified at this time. As such, the optimization is not based on a mere estimate.

Additional features and advantages of the present invention are described in, and will be apparent from, the Detailed Description of the Preferred Embodiments and from the Drawings.

DETAILED DESCRIPTION OF THE PREFERRED EMBODIMENTS

Figure 1:
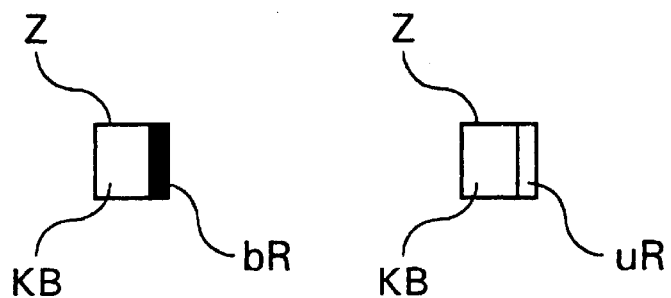
FIG. 1 shows a cell of the reprogrammable combinational circuit of the present invention which includes a combinational block and a register.

FIG. 1 shows two possible states of an individual cell Z. The cell is composed of a combinational block KB and of a register which has the option of being switched used, bR, or switched unused uR.

Figure 2:
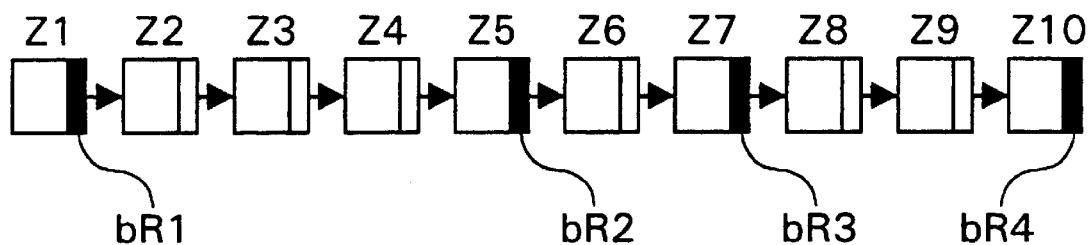
FIG. 2 shows a row of combinational blocks and registers before the optimization of the signal running times.

FIG. 2 shows a row of combinational blocks and registers before an optimization of the signal running time. Given reprogrammable combinational circuits, there is the optional possibility of bridging the register of a cell after programming and, thus, switching it unused or switching it used. FIG. 2 shows a possible used-unused sequence of registers in cells Z1 through Z10 after the programming of the reprogrammable combinational circuit. The first used register bR1 is followed by 4 combinational blocks before the next register bR2 is switched used. 2 combinational blocks then follow up to register bR3 which is switched used and, finally, another 3 combinational blocks follow before register bR4 is switched used.

FIG. 2 is to be viewed as being a portion of a row of cells from a reprogrammable combinational circuit, wherein a plurality of reprogrammable combinational circuits also can be connected to one another.

Figure 3:
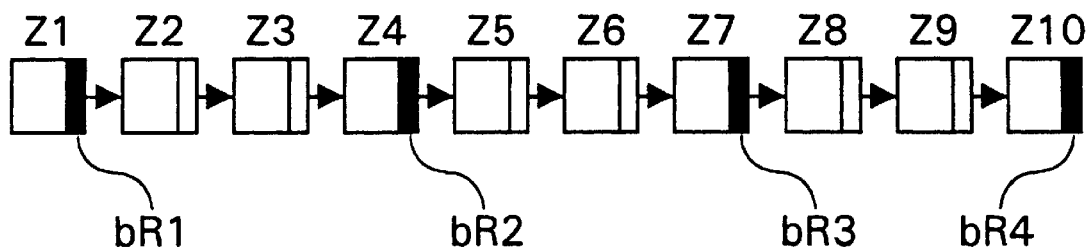
FIG. 3 shows a row of combinational blocks and registers after the optimization of the signal running times.

FIG. 3 shows how the optimization of the signal running time is implemented. Proceeding from FIG. 2, individual registers are reprogrammed to that end; i.e,. switched from used to unused and vice versa. It is assumed here that the pluralities of combinational blocks between the registers are equal, wherein they also can be approximately equal with reference to the respective application. In FIG. 3, thus, three combinational blocks which are switched used are respectively shown between the registers bR1 and bR2, bR2 and bR3, and bR3 and bR4 wherein the signal running times through such combinational blocks is approximately the same. The reprogrammable combinational circuit is thus optimized in view of the signal running time; the maximally allowable clock rate assuring the greatest possible performance capability of the module.

When an optimized program code has been identified for the reprogrammable combinational circuit, such code can be employed for the entire series of reprogrammable combinational circuits.

Although the present invention has been described with reference to specific embodiments, those of skill in the art will recognize that changes may made thereto without departing from the spirit and scope of the invention as set forth in the hereafter appended claims.

I claim as my invention:

1. A reprogrammable combinational circuit, comprising:

a plurality of individual cells wherein each cell includes a combinational block and a register, and wherein each register is switched to one of a used and unused state upon programming of the reprogrammable combinational circuit; and a program code for optimizing signal running times, wherein the registers again may be switched to one of the used and unused state such that a substantially equal number of combinational blocks are arranged between registers switched to a used state.

2. A method for optimizing signal running times of a reprogrammable combination circuit having a plurality of individual cells wherein each cell includes a combinational block and a register, the method comprising the steps of:

programing the reprogrammable combinational circuit wherein a row of combinational blocks and registers is formed and each register is switched to one of a used and unused state; and optimizing signal running times after the step of programming wherein the registers again may be switched to one of the used and unused state such that a substantially equal number of combinational blocks are arranged between two registers switched to the used state.

3. The method according to claim 2, wherein:

signal running times in the combinational blocks are substantially equal;

after the step of programming the reprogrammable combinational circuit, the number of the cells between two cells with registers switched to the used state differs; and after the step of optimizing signal running times, the number of cells between two cells with registers switch to the used state is substantially equal.

* * * * *